(12) United States Patent  (10) Patent No.: US 6,643,145 B1
Harrison  (45) Date of Patent: Nov. 4, 2003

(54) HIGH RESOLUTION DIGITAL DIODE EMULATOR FOR DC-DC CONVERTERS

(75) Inventor: William Todd Harrison, Apex, NC (US)

(73) Assignee: Intersil Americas Inc., Milpitas, CA (US)

( * ) Notice: Subject to any disclaimer, the term of this patent is extended or adjusted under 35 U.S.C. 154(b) by 0 days.

(21) Appl. No.: 10/206,562

(22) Filed: Jul. 26, 2002

(51) Int. Cl.$^7$ ................................................ H02M 3/24
(52) U.S. Cl. .......................................... 363/16; 363/97
(58) Field of Search ............................. 363/16, 56.01, 363/95, 97, 131

(56) References Cited

U.S. PATENT DOCUMENTS

| | | | | |
|---|---|---|---|---|
| 5,077,490 A | * | 12/1991 | Brown | 326/110 |
| 5,373,435 A | * | 12/1994 | Jayaraman et al. | 363/98 |
| 5,502,632 A | * | 3/1996 | Warmerdam et al. | 363/98 |
| 5,666,280 A | * | 9/1997 | Janaswamy et al. | 363/98 |
| 6,031,412 A | * | 2/2000 | Genova et al. | 327/537 |
| 6,060,948 A | * | 5/2000 | Tarantola et al. | 327/589 |
| 6,075,391 A | * | 6/2000 | Tarantola et al. | 327/111 |

* cited by examiner

Primary Examiner—Bao Q. Vu
(74) Attorney, Agent, or Firm—Allen, Dyer, Doppelt, Milbrath & Gilchrist, P.A.

(57) ABSTRACT

A digital diode emulator (DDE) for a DC-DC converter increments a digital counter with a high frequency clock. For each inductor current cycle, the counter counts between turn-on and turn-off of the output switching circuit's lower switch. When the contents of the counter match a modification of a count latched from the previous inductor current cycle, a turn-off signal is supplied to the control logic. If the previous inductor current cycle's turn-off signal occurred late, the latched count is decremented by one bit. If the previous cycle's turn-off signal occurs early, the latched count is incremented by one bit. Over successive inductor current cycles, the digital diode emulator effectively 'dithers' the turn-off time of the switching circuit's lower switch about the zero-crossing point of the inductor current.

15 Claims, 5 Drawing Sheets

HIGH RESOLUTION DIGITAL DIODE EMULATOR FOR DC-DC CONVERTERS

FIELD OF THE INVENTION

The present invention relates in general to DC power supply circuits and components therefor, and is particularly directed to a high resolution digital diode emulator (DDE) for a DC-DC converter. At each inductor current (IL) cycle, a digital counter counts a high frequency clock signal from the turn-off time of the gate of a first pass element of the converter's output switching circuit until the gate of a second pass element is turned off. The contents of the digital counter are latched in memory, and incremented or decremented at the next IL cycle depending upon whether diode emulation has occurred in the current cycle too early or too late. The gate of a second pass element is turned off when the contents of the counter match the modified latch count.

BACKGROUND OF THE INVENTION

FIG. 1 diagrammatically illustrates the general circuit configuration of a conventional DC-DC voltage converter as comprising a DC-DC controller 10, which switchably controls the turn-on and turn-off of a pair of electronic power-switching devices, respectively shown as an upper FET pass element 20 and a lower FET pass element 30. These FET switching devices have their drain-source paths coupled in series between first and second reference voltages (VDD and ground (GND)). Each Pass element contains a controllable switch shown as an upper switch 22 and a lower switch 32. The upper pass element contains a body diode 21 in parallel with the drain-source path such that the reverse current flows through the body diode toward VDD. The lower pass element 30 contains a body diode 31 in parallel with the drain-source path such that reverse current flows through the body diode from GND. A common or phase voltage node 25 between the two power FETs 20/30 is coupled through an inductor 40 to a capacitor 50 coupled to a reference voltage terminal (GND). The connection 45 between the inductor 40 and the capacitor 50 serves as an output node from which an output voltage VOUT is derived.

The DC-DC converter's controller 10 includes a gate driver circuit 11, that is operative to controllably turn the two switching devices 20 and 30 on and off, in accordance with a periodic pulse signal waveform (typically, a pulse width modulation (PWM) switching waveform such as that shown at PWM in the timing diagram of FIG. 2) generated by a (PWM) logic circuit 12. The upper switch 22 is turned on and off by an upper gate switching signal UG applied by the gate driver 11 to the gate of the pass element 20, and the lower switch 32 is turned on and off by a lower gate switching signal LG applied by the gate driver 11 to the gate of the pass element 30.

For the case of the timing diagram of FIG. 2, the upper switch 22 is turned on in accordance with the rising edge of the PWM waveform and turned off in accordance with the falling edge of the PWM waveform, whereas the lower switch 32 is turned on in accordance with the falling edge of the PWM waveform. During relatively light load conditions, where the ripple current IL through the inductor 40 is larger than the average inductor current, it is desired to revert to a basic DC-DC converter. This is effected by effectively replacing the lower switch 32 with a diode function optimally turning off the lower switching device coincident with the negative-going zero-crossing of the inductor ripple current. IL, so as to prevent current return flow back into the converter, and maximizing efficiency.

Prior art techniques to accomplish this diode transition operation may sense the ripple current flowing through the inductor 40 via node 45, or may sense the phase voltage at node 25 and couple the sensed variation to a comparator. FIG. 1 shows the example where the phase node voltage VPH is coupled to a comparator 13. Ideally, the comparator, which is enabled by the PWM logic circuit, will provide an output coincident with the negative-going, zero-crossing of the ripple current, in response to which the controller's output driver turns off the lower switch.

Unfortunately, this technique is successful only at relatively low PWM frequencies, due to the propagation delay through the comparator. To obtain reasonably acceptable performance at relatively high PWM frequencies (e.g., on the order of 1 MHZ and above), it is necessary to use a comparator that requires a large bias current, which increases cost and is not practical for low power applications. This technique is also susceptible to errors due to noise caused by the switching power devices.

SUMMARY OF THE INVENTION

In accordance with the present invention, shortcomings of conventional DC-DC converter diode emulators, including those described above, are effectively obviated by means of a high resolution digital diode emulator (DDE), which monitors the converter's phase voltage node, and employs a high frequency clock and a digital counter. For each periodic signal cycle (such as a PWM cycle), or a pulse frequency modulation (PFM), the digital counter counts high frequency clock signals beginning with the turn-off time of a first pass element of the converter's output switching circuit until its second pass element is turned off.

The contents of the digital counter are latched in a count memory, whose contents are incremented or decremented at the next cycle, depending upon whether diode emulation has occurred too early or too late. When the control loop begins operating in diode emulation mode, the count memory will have been pre-loaded with the maximum digital count that can be reached by the digital counter. This serves to prevent premature generation of the lower switch turn-off signal. Once the DDE begins cycling, the count memory will then be successively loaded with the contents of the digital counter, in response to respective load signals for sequential cycles of the periodic signal.

Although the lower switch turn-off signal is not expected to occur at the exact moment that the inductor current becomes zero amps, it will be close. Where an inductor current cycle's turn-off signal to the power switching circuit's lower switch occurs too late, which allows the inductor current to go below zero amps, the negative inductor current flows through the upper pass element's body diode causing the phase voltage to quickly increase toward the positive supply voltage, resulting in a noticeably high level region. On the other hand, where an inductor current cycle's turn-off signal to the power switching circuit's lower switch occurs too early, the positive inductor current flows through the lower pass element's body diode until it reaches zero amps, so that the phase voltage shown goes to a diode drop below ground before it transitions to the level of the output voltage.

A comparator produces an output signal used by the control logic to turn off the lower switch, in response to the contents of the digital counter matching the modified latch count. If the previous IL cycle's turn-off signal to the power switching circuit's lower switch occurred too late, the latched count value is decremented by one bit. This serves to effectively advance the time at which the output of the comparator changes state—by one period of the high frequency clock. If the previous IL cycle's turn-off signal to the power switching circuit's lower switch occurs early, the latched count value is incremented by one bit, so as to effectively delay the time at which the output of the comparator changes state—by one period of the high frequency clock.

BRIEF DESCRIPTION OF THE DRAWINGS

FIGS. 5–10 are respective DC-DC converter parameter vs. time waveforms associated with the load current (ILOAD) quickly going to a light load condition and the DDE going into effect, wherein FIG. 5 shows a variation in load current, FIG. 6 shows a tristate signal issued by the controller associated with variations in ripple current in the waveform of FIG. 5, FIG. 7 is an enlargement of a portion of the current load waveform of FIG. 5, FIG. 8 shows an enlargement of a portion of the waveform of FIG. 6, FIG. 9 shows a variation in phase voltage, and FIG. 10 shows a variation in the LGOFF signal;

FIGS. 11–13 show the result from the DC-DC controller as the load current slowly goes into a light load condition, wherein FIG. 11 shows the load current waveform, FIG. 12 shows a periodic signal (PWM) waveform, and FIG. 13 shows the LGOFF waveform;

FIGS. 14–16 are timing diagrams that illustrate the case where the inductor current cycle's turn-off signal to the power switching circuit's lower switch is late, wherein FIG. 14 shows the LGOFF signal, FIG. 15 shows the inductor current, and FIG. 16 shows the phase voltage; and FIGS. 17–19 are timing diagrams that illustrate the case where the inductor current cycle's turn-off signal to the power switching circuit's lower switch is early, wherein FIG. 17 shows the LGOFF signal, FIG. 18 shows the inductor current, and FIG. 19 shows the phase voltage.

DETAILED DESCRIPTION

Figure 1:
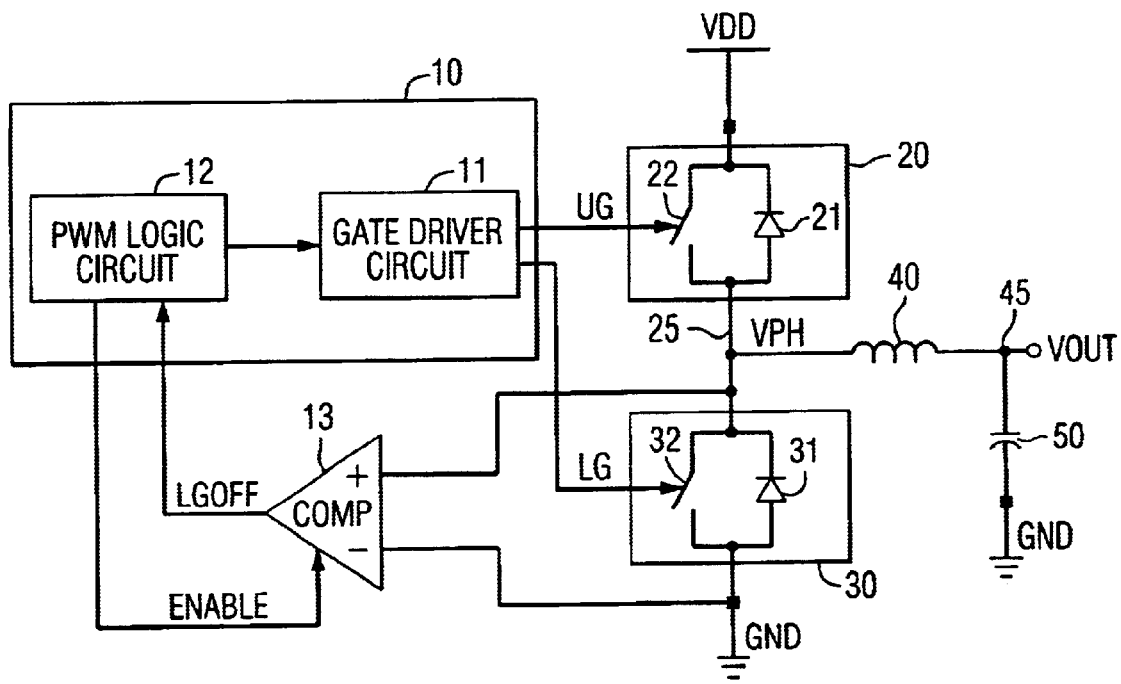
FIG. 1 diagrammatically illustrates the general circuit configuration of a conventional buck DC-DC voltage converter.
Figure 2:
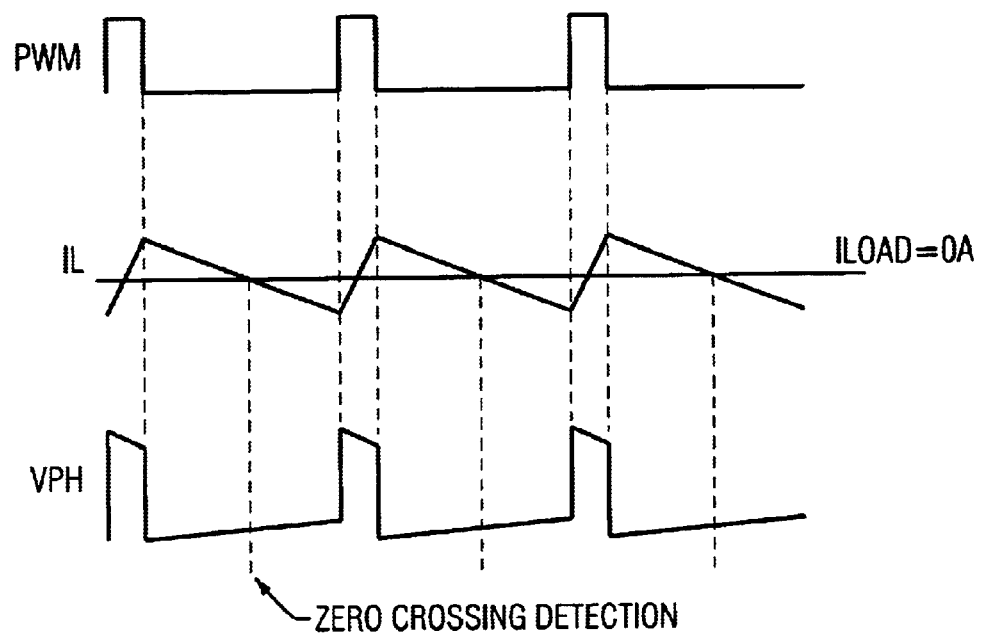
FIG. 2 is a timing diagram associated with the operation of the buck DC-DC voltage converter of FIG. 1.

Before describing in detail the digital diode emulator of the present invention, it should be observed that the invention resides primarily in prescribed modular arrangements of conventional digital circuits and the integration of those digital circuits into the architecture of a traditional DC-DC converter. In a practical implementation that facilitates their incorporation into existing printed circuit cards, these modular arrangements may be readily implemented in a field programmable gate array (FPGA), or an application specific integrated circuit (ASIC) chip.

Consequently, the configuration of such circuit arrangements and their operation have, for the most part, been illustrated in the drawings by readily understandable block diagrams, which show only those specific details that are pertinent to the present invention, so as not to obscure the disclosure with details which will be readily apparent to those skilled in the art having benefit of the description herein. Thus, the illustrations are primarily intended to show the major components of the invention in convenient functional groupings, whereby the present invention may be more readily understood.

Figure 3:
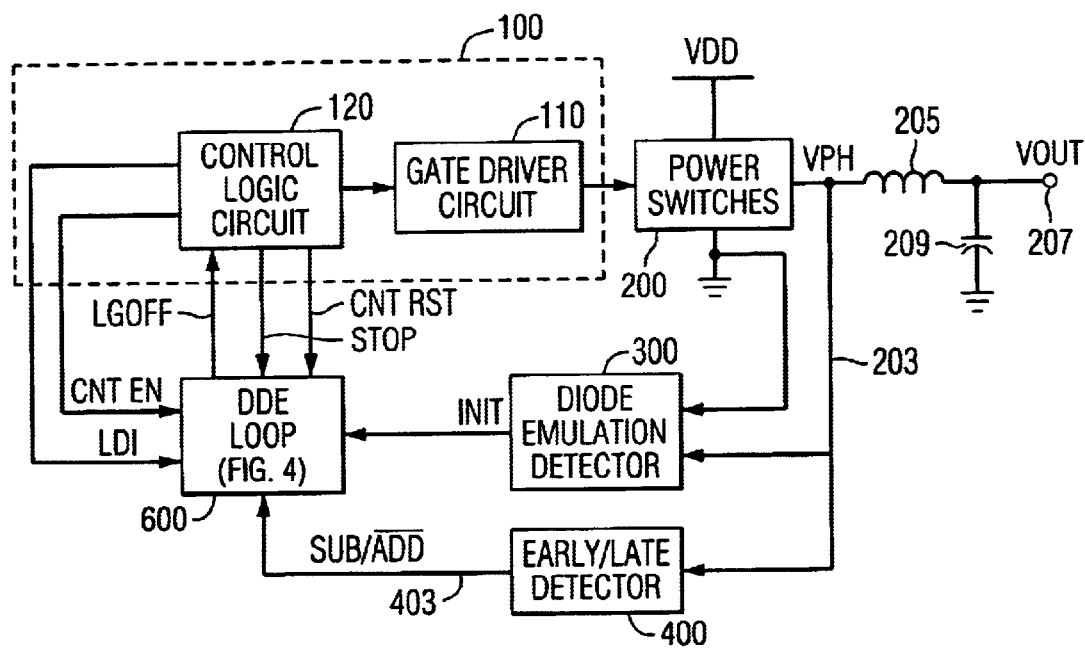
FIG. 3 diagrammatically illustrates the overall architecture of a buck DC-DC voltage converter employing the DDE in accordance with the present invention.

Attention is now directed to FIG. 3, wherein the overall architecture of a DC-DC voltage converter incorporating the digital diode emulator of the present invention is diagrammatically illustrated as comprising a DC-DC controller unit 100. Like the controller 10 of FIG. 1, described above, the DC-DC controller unit 100 contains a control logic circuit 120, which generates a periodic control signal (such as, but not limited to a PWM signal), which controls a gate driver circuit 110 to produce respective upper and lower switching control signals UG and LG for switchably controlling the turn-on and turn-off of a pair of electronic power switching devices within a power switching circuit 200.

As in the DC-DC converter of FIG. 1, the power switching circuit 200 may contain respective upper and lower switching devices, having their drain-source paths coupled in series between first and second reference voltages (VDD and ground (GND)). A common node between the two power FETs is coupled to a phase voltage (VPH). node 203. The phase voltage node 203 is coupled through an inductor 205 to an output DC voltage (VOUT) node 207. A capacitor 209 is coupled between output node 207 and a reference potential (GND).

Phase voltage node 203 is further coupled to a diode emulation detector circuit 300, which may be implemented as a threshold comparator, and is operative to detect whether the DC-DC converter's control loop is to operate in diode emulation mode. When the control loop begins operating in diode emulation mode, detector 300 asserts a prescribed logic level (e.g., a logical '1') on an initialization logic signal line INIT coupled to a digital diode emulator (DDE) 600, shown in detail in FIG. 4, to be described.

During the time that the DDE is not enabled (and therefore immediately prior to its being enabled), the logic level of the INIT input presets a count latch memory within the DDE to the maximum digital count that can be reached by the DDE's internal digital counter. Preloading the count latch memory with the maximum count ($2^N-1$) prior to digital diode emulation mode serves to ensure that the lower power switching device turn-off signal LGOFF produced by the DDE will not occur prematurely.

The phase voltage node 203 is also coupled to an early/late detector circuit 400 which detects whether turn-off of the power switching circuit's lower switch for the immediately previous IL cycle has occurred either prior or subsequent to the time at which the current flowing through the inductor 205 crossed zero. The result of this determination governs the logical state (1/0) of a SUB/ADD BAR output 403, which is used to controllably increment/decrement the contents of the latched digital counter value stored in a count memory within the DDE 600, as will be described.

For this purpose, the early/late detector circuit 400 monitors the level of the phase voltage just after the lower power switching device turn-off signal LGOFF has been asserted high. If the LGOFF signal is asserted late, which allows the inductor current to go below zero amps, then the phase voltage will quickly increase toward the positive supply voltage, resulting in a noticeably high voltage level of phase voltage just after the LGOFF signal goes high. In this event, the output of the early/late detector circuit 400 is asserted as a logical '1', which is used to decrease (by one bit) the previous IL cycle's latched count of the digital counter. Otherwise, the output of the early/late detector circuit 400 is a logical '0'.

DDE 600 receives a further load control input LDI and a STOP input from the control logic circuit 120 within the controller 100. As long as the DDE is enabled, the LDI input to the DDE is used as a load or latch input to a count memory for each respective IL cycle of the periodic control signal. In response to the LDI signal, which changes state when the LG signal turns off the lower switch, the count memory latches the count value 'K' currently present in the digital counter. The STOP input controllably inhibits generation of the high frequency clock signal that is used to increment the digital counter within the DDE. When the DDE is not being employed, the clock generator is disabled by the STOP signal and a power switching device turn-off control signal LGOFF produced by a digital comparator within the DDE is ignored.

The turn-off control signal LGOFF is used by the logic circuit 120 to produce the turn-off defined state for the signal LG for the lower switch of the power switching circuit 200. Clearing or resetting the DDE's digital counter is defined by a count reset CNT RST signal from the logic circuit at the end of each cycle of the periodic control signal; the digital counter is enabled by a count enable signal CNT EN from the logic circuit when the output drive signal goes low.

If the turn-off of the power switching circuit's lower switch for the immediately previous IL cycle occurred too soon, namely before the inductor current reached zero amps, the state of the SUB/ADD BAR output 403 is asserted to a logical '0', which increases (by one bit) the previous IL cycle's latched count of the digital counter. On the other hand, if the turn-off of the power switching circuit's lower switch for the immediately previous IL cycle occurred too late, namely after the inductor current reached zero amps, the state of the SUB/ADD BAR output 403 is asserted to a logical '1', which is used to decrease (by one bit) the previous IL cycle's latched count of the digital counter.

Figure 4:
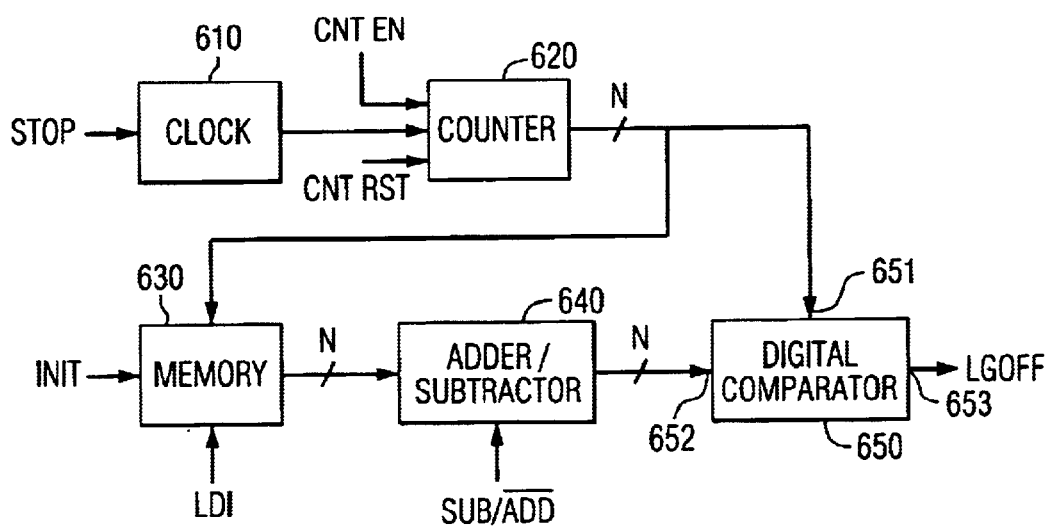
FIG. 4 is a detailed block diagram of the configuration of the DDE in accordance with the present invention.

A non-limiting implementation of the DDE 600 is shown in the block diagram of FIG. 4 as comprising a high frequency clock generator 610, which is operative to supply a high frequency clock signal to an N-bit digital counter 620. The clock signal generator 610 is coupled to receive the STOP signal from the control logic circuit 120. The STOP signal is employed to controllably force operation of the clock generator. The frequency of the clock signal produced by the clock signal generator 610 and the capacity of the digital counter 620 determine the resolution of the DDE.

Preferably, the clock signal has a frequency at least an order of magnitude greater than that of the periodic control signal, and the higher the frequency—the higher the resolution to which the digital diode emulator is able to 'quasi'-converge on either side of the point at which the inductor current reaches zero. The capacity of counter 620 is based upon the clock signal frequency and the duty cycle of the periodic control signal, so that the counter 620 will not overflow irrespective of how late the turn-off signal to the switching circuit's lower switch occurs during any IL cycle.

The contents of the digital counter 620 are coupled to a count memory 630 and to a first input 651 of a digital comparator 650. As pointed out above, during a respective DDE cycle, the count memory 630 latches the count value 'K' of the digital counter 620 in response to the LDI signal. At initialization of the DDE, the count memory 630 will have been preloaded with the maximum count value ($2^N-1$) by the INIT input, to prevent the lower power switching device turn-off signal LGOFF from being prematurely asserted high, as described above. Once the DDE begins cycling, the logic value of the INIT input changes state so that the count memory is no longer preset to the maximum count value ($2^N-1$); instead, the count memory 630 will be successively loaded with the contents of the digital counter 620 in response to respective LDI signals for sequential IL cycles.

The latched count value 'K' contents of the count memory 630 are coupled to an add/subtract unit 640. The add/subtract unit 640 either increments or decrements the count value latched in the counter memory 630, in accordance with the state of the SUB/ADD BAR output 403 of the early/late detector 400, and will couple the modified latch count value (K+1 or K−1) to a second input 652 of the digital comparator 650. The output 653 of the digital comparator 650 defines the logic state of the DDE's output line LGOFF, based on an equality relationship between its inputs 651 and 652.

As long as the count value of counter 620 is less than or equal to the output of the add/subtract unit 640, the output 653 and thereby the state of the LGOFF signal has a first logical state (e.g., '1'), so that the lower power switch of the power switching circuit 200 will not be turned off. However, in response to the count value of counter 620 exceeding the output of the add/subtract unit 640, the output 653 and thereby the state of the LGOFF signal changes to a second logical state (e.g., '1'), in response to which the control logic circuit changes the state of the LG gate drive to low and turns off the lower switch of the power switching circuit 200.

The DDE of the present invention operates as follows. Prior to the DDE being placed in operation, the clock generator 610 is disabled by the STOP signal and the LGOFF output of the digital comparator 650 is ignored, as described above. In addition, count memory 630 is preloaded with the maximum count value ($2^N-1$) that can be attained by the digital counter 620. During the first IL cycle of DDE operation, with the STOP signal no longer inhibiting the operation of the clock generator 610, the previously cleared counter 620 begins counting clock signals, when the change in state of the gate drive signal LG from gate driver circuit 110 turns on the lower switch of power switching circuit 200 (at the same time that the control pulse signal goes low).

During this first cycle, since the count memory 630 has been preloaded with the maximum count ($2^N-1$), the value of the accumulated count at the first input 651 of the digital comparator 650 will continue to be less than that supplied to its second input 652, to prevent the lower power switching device turn-off signal LGOFF produced by the DDE from occurring prematurely. Thus, for the first IL cycle of the DDE, the turn-off of the lower switch is still controlled by the DC-DC controller unit 100. Eventually, the converter's controller loop will cause the gate drive signal LG from gate driver circuit 110 to change state—turning off the lower switch.

In response to this change in state of the LG signal, the LDI signal changes state, and the count memory 630 latches in the count (K) contents of counter 620. At the next IL cycle, the count memory 630 will latch in the first cycle's count K and a least significant bit value of '1' will be either added or subtracted from K by add/subtract unit 640, depending upon the previous IL cycle's lower switch turn-off time accuracy. As pointed out above, if the previous cycle's turn-off of the power switching circuit's lower switch occurred too late, namely after the inductor current reached zero amps (which is expected to be the case for the very first cycle of DDE operation), the state of the SUB/ADD BAR output 403 will be asserted to a logical '1', which decreases (by one bit) the previous cycle's latched count of the digital counter 620. This serves to effectively advance the time at which the output 653 of the comparator 650 changes state—by one period of the high frequency clock produced by the clock generator 610.

On the other hand, if the previous IL cycle's turn-off of the power switching circuit's lower switch occurs early (i.e., prior to the inductor current reaching zero amps), then the SUB/ADD BAR input to the add/subtract unit 640 will be low during the next cycle, corresponding to a SUB/ADD BAR input of a logical '0'. This increases (by one bit) the previous IL cycle's latched count of the digital counter 620, and thereby effectively delays the time at which the output 653 of the comparator 650 changes state, by one period of the high frequency clock produced by clock generator 610.

Figure 5:
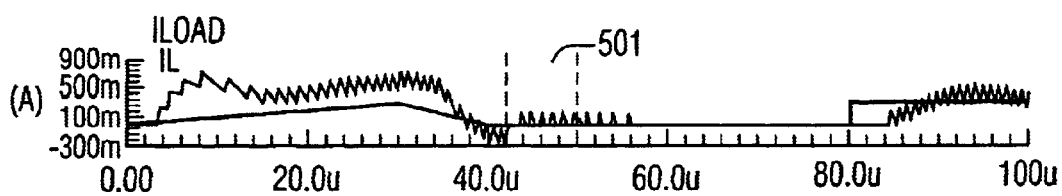
Figure 6:
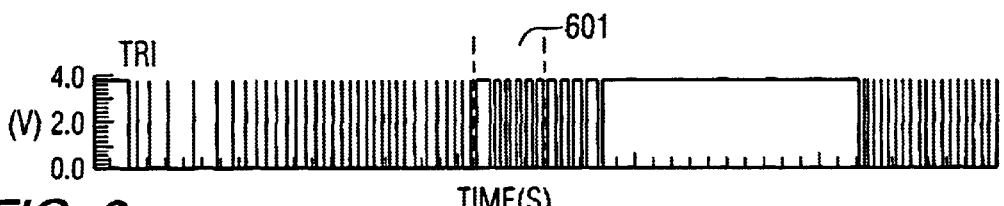
Figure 7:
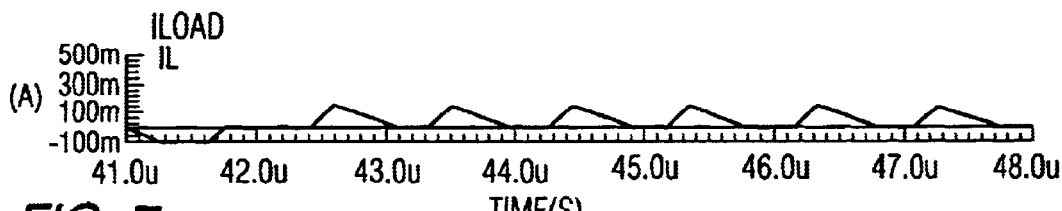
Figure 8:
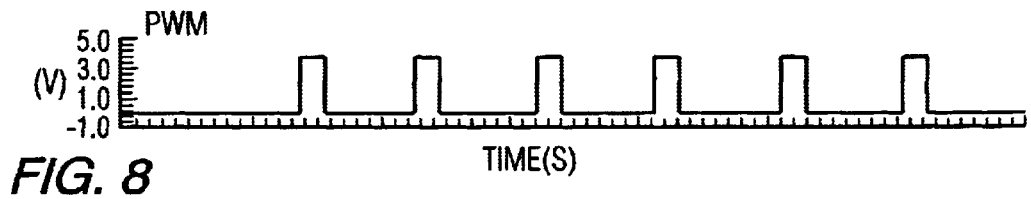
Figure 9:
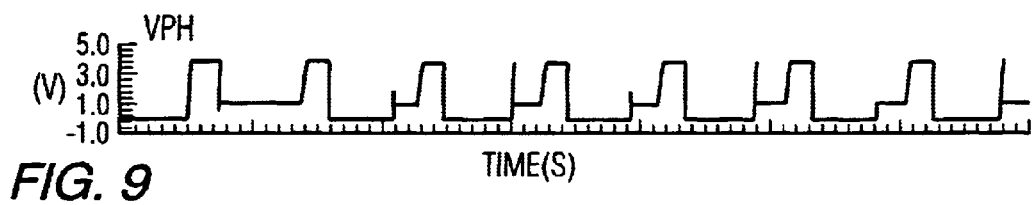
Figure 10:
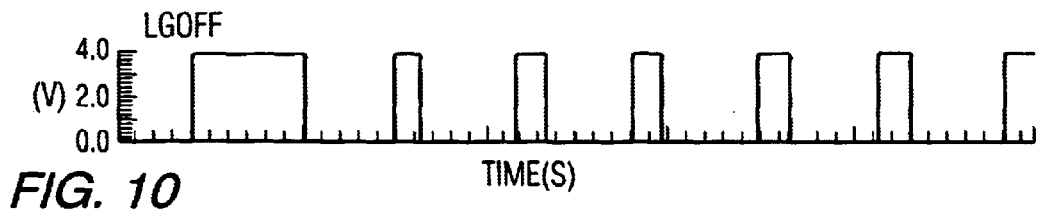

FIGS. 5–10 are respective DC-DC converter parameter vs. time waveforms associated with the load current (ILOAD) quickly going to a light load condition and the DDE going into effect. In particular, FIG. 5 shows variation in load current, while FIG. 6 shows a tristate signal issued by the controller associated with variations in ripple current in the waveform of FIG. 5. FIG. 7 is an enlargement of portion 501 of the current load waveform of FIG. 5, while FIG. 8 shows an enlargement of associated portion 601 of the waveform of FIG. 6. FIGS. 9 and 10 respectively show variations in phase voltage and the LGOFF signals associated with the respective enlarged portions of FIGS. 5 and 6.

Figure 11:
Figure 12:
Figure 13:
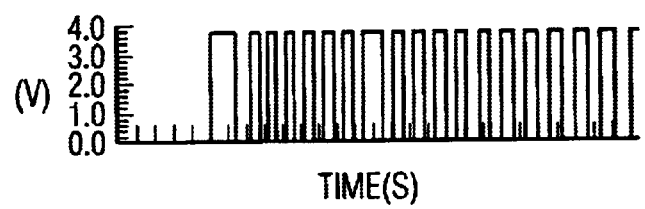

FIGS. 11–13 show the result from the same DC-DC controller as the load current slowly goes into a light load condition. In particular, FIG. 11 shows the load current waveform, FIG. 12 shows a control pulse signal (PWM) waveform and FIG. 13 shows the LGOFF waveform. In each case a smooth transition can be seen from the continuous conduction mode into the discontinuous conduction mode.

Figure 14:
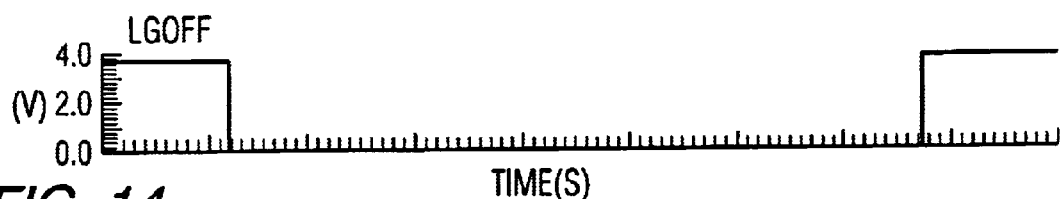
Figure 15:
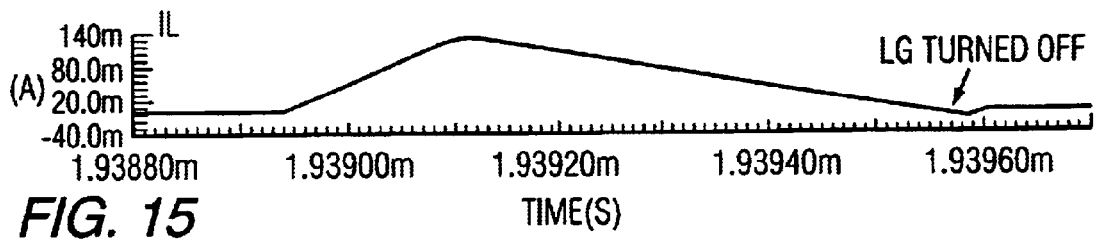
Figure 16:
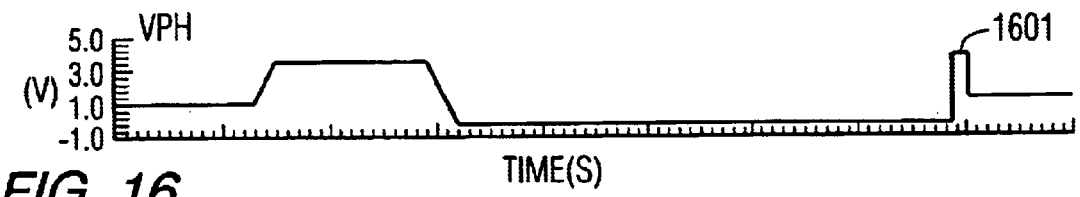

FIGS. 14–19 are timing diagrams that illustrate the two cases of late and early occurrences of the LGOFF signal, described above. While it is not expected that the LG gate signal will be turned off at the exact moment that the inductor current becomes zero amps, it is expected that the time of turn-off of the lower switch will be close. In particular, FIGS. 14–16 show the case where the current cycle's turn-off of the power switching circuit's lower switch occurs too late. FIG. 14 shows the LGOFF signal occurring after the inductor current of FIG. 15 has reached zero amps. Since this late assertion of the LGOFF signal allows the inductor current to go below zero amps, the phase voltage shown in FIG. 16 quickly increases toward the positive supply voltage, resulting in a noticeably high level region 1601.

Figure 17:
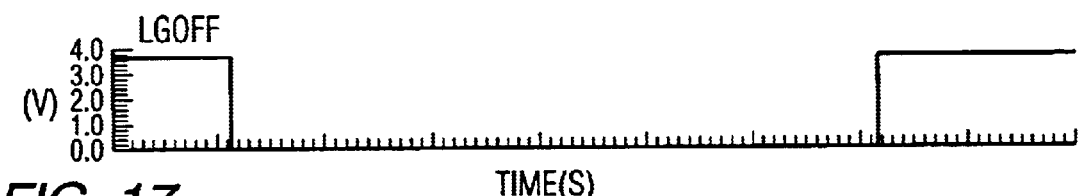
Figure 18:
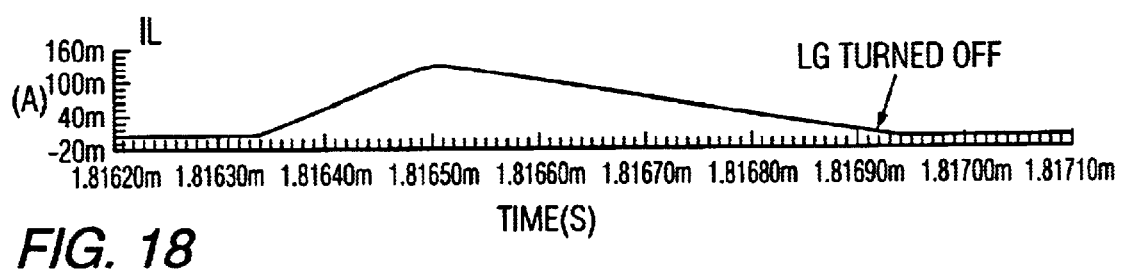
Figure 19:
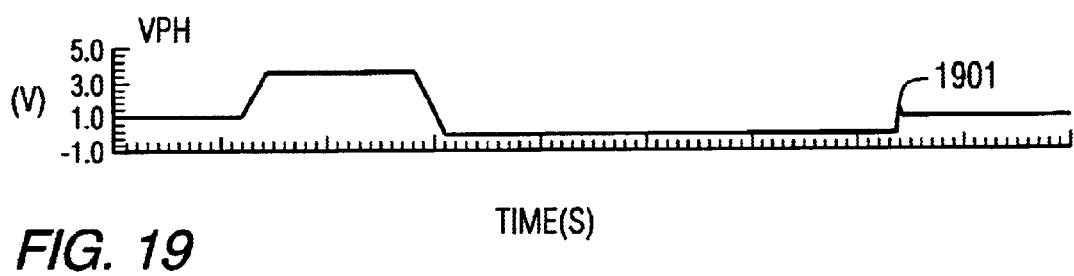

FIGS. 17–19 show the case where the current cycle's turn-off of the power switching circuit's lower switch occurs early. FIG. 17 shows the LGOFF signal occurring prior to the inductor current of FIG. 18 reaching zero amps. Here, the early assertion of the LGOFF signal forces the inductor current to flow through the body diode of the lower pass element until it reaches zero amps, so that the phase voltage shown in FIG. 19 goes to a diode voltage drop below ground until it transitions to the level of the output voltage VOUT when the inductor current becomes zero, rather than the positive supply voltage.

As will be appreciated from the foregoing description, shortcomings of conventional DC-DC converter diode emulators are effectively obviated by the high resolution digital diode emulator of the present invention, which uses a high frequency clock and a digital counter to effectively 'dither' the turn-off time of the switching circuit's lower switch about the zero-crossing point of the inductor current. Thus, over the course of successive cycles of the control signal waveform, the digital diode emulator 'quasi'-converges the turn-off time to the point at which the inductor current reaches zero.

While we have shown and described an embodiment in accordance with the present invention, it is to be understood that the same is not limited thereto but is susceptible to numerous changes and modifications as known to a person skilled in the art, and we therefore do not wish to be limited to the details shown and described herein, but intend to cover all such changes and modifications as are obvious to one of ordinary skill in the art.

What is claimed is:

1. For use with a DC-DC voltage converter, having a controller which generates a switching signal, that switchably controls operation of a switching circuit, containing first and second electronic power switching devices coupled between respective power supply terminals, and having a common node thereof coupled through an inductor element to an output voltage terminal and a capacitor element, a method of digitally emulating diode operation of said switching circuit during off time of said switching signal, said method comprising the steps of:

(a) generating a switch-off signal for turning off said second electronic power switching device;

(b) sensing a digital state of a phase voltage at said common node;

(c) over successive cycles of said switching signal, adjusting the turn-off time of said switch-off signal based upon respective contents of a digital counter, the contents of which are successively modified by a clock signal having a frequency in excess of said switching signal, and in accordance with successively sensed digital states of said voltage at said common node.

2. The method according to claim 1, wherein step (c) comprises, wherein said controller is operative to turn on said second electronic power switching device in accordance with a first switching state of said switching signal, and to turn off said second electronic power switching device and turn on said first electronic power switching device in accordance with a second switching state of said switching signal.

3. The method according to claim 1, wherein step (c) comprises the steps of (c1) for each cycle of said switching signal, causing said digital counter to count said clock signal from a prescribed attribute of said switching signal until said switch-off signal for turning off said second electronic power switching device, and thereby produce a count value, (c2) storing said count value produced in step (c1), and (c3) for a respective cycle of said switching signal, defining said turn-off time of said switch-off signal in accordance with a prescribed relationship between contents of said digital counter and said count value, as produced in step (c1) for an immediately previous cycle of said switching signal.

4. The method according to claim 3, wherein step (c3) includes, for said respective cycle of said switching signal, selectively modifying said count value, as stored in step (c2) for said immediately previous cycle of said switching signal, based upon whether the switch-off signal for turning off said second electronic power switching device during said immediately previous cycle of said switching signal occurred prior or subsequent to current through said inductor reaching zero, to produce a modified count value, and defining said turn-off time of said switch-off signal in response to said contents of said digital counter corresponding to said modified count value.

5. The method according to claim 3, wherein step (c3) comprises, for said respective cycle of said switching signal, selectively incrementing said count value, as stored in step (c2) for said immediately previous cycle of said switching signal, in response to the switch-off signal for turning off said second electronic power switching device during said immediately previous cycle of said switching signal having occurred prior to current through said inductor reaching zero, to produce an incremented count value, and defining said turn-off time of said switch-off signal in response to said contents of said digital counter corresponding to said incremented count value.

6. The method according to claim 3, wherein step (c3) comprises, for said respective cycle of said switching signal, selectively decrementing said count value, as stored in step (c2) for said immediately previous cycle of said switching signal, in response to the switch-off signal for turning off said second electronic power switching device during said immediately previous cycle of said switching signal having occurred subsequent to current through said inductor reaching zero, to produce a decremented count value, and defining said turn-off time of said switch-off signal in response to said contents of said digital counter corresponding to said decremented count value.

7. A digital diode emulator for a DC-DC voltage converter having a controller, which generates a switching signal that switchably controls operation of a switching circuit containing first and second electronic power switching devices coupled between respective power supply terminals, a common node thereof being coupled through an inductor element to an output voltage terminal and a capacitor, said digital diode emulator comprising:
  a switch-off signal control circuit, which is operative to generate a turn-off signal for turning off said second electronic power switching device;
  a turn-off signal controller, which is operative, over successive cycles of said switching signal, to adjust the turn-off time of said switch-off signal based upon respective contents of a digital counter, the contents of which are successively modified by a clock signal having a frequency in excess of said switching signal, and in accordance with successively sensed digital states of said voltage at said common node.

8. The digital diode emulator according to claim 7, wherein step switch-off signal control circuit is operative to turn on said second electronic power switching device in accordance with a first switching state of said switching signal, and to turn off said second electronic power switching device and turn on said first electronic power switching device in accordance with a second switching state of said switching signal.

9. The digital diode emulator according to claim 7, wherein said turn-off signal controller is operative, for each cycle of said switching signal, to cause said digital counter to count said clock signal from a prescribed attribute of said switching signal until said switch-off signal for turning off said second electronic power switching device, and thereby produce a count value, which is stored in a count memory, and wherein, for a respective cycle of said switching signal, said turn-off signal controller is operative to define said turn-off time of said switch-off signal, in accordance with a prescribed relationship between contents of said digital counter and said count value, as stored in said count memory for an immediately previous cycle of said switching signal.

10. The digital diode emulator according to claim 9, wherein said turn-off signal controller is operative, for said respective cycle of said switching signal, to selectively modify said count value, as stored in said count memory for said immediately previous cycle of said switching signal, based upon whether the switch-off signal for turning off said second electronic power switching device during said immediately previous cycle of said switching signal occurred prior or subsequent to current through said inductor reaching zero, to produce a modified count value, and to define said turn-off time of said switch-off signal in response to said contents of said digital counter corresponding to said modified count value.

11. The digital diode emulator according to claim 10, wherein said turn-off signal controller is operative, for said respective cycle of said switching signal, to selectively increment said count value, as stored in said count memory for said immediately previous cycle of said switching signal, in response to the switch-off signal for turning off said second electronic power switching device during said immediately previous cycle of said switching signal having occurred prior to current through said inductor reaching zero, to produce an incremented count value, and to define said turn-off time of said switch-off signal in response to said contents of said digital counter corresponding to said incremented count value.

12. The digital diode emulator-according to claim 10, wherein said turn-off signal controller is operative, for said respective cycle of said switching signal, to selectively decrement said count value, as stored in said count memory for said immediately previous cycle of said switching signal, in response to the switch-off signal for turning off said second electronic power switching device during said immediately previous cycle of said switching signal having occurred subsequent to current through said inductor reaching zero, to produce a decremented count value, and to define said turn-off time of said switch-off signal in response to said contents of said digital counter corresponding to said decremented count value.

13. In a diode emulator for a DC-DC voltage converter, having a controller which generates a switching signal, that switchably controls operation of a switching circuit, containing first and second electronic power switching devices coupled between respective power supply terminals, and having a common node thereof coupled through an inductor element to an output voltage terminal and a capacitor element, the improvement wherein said diode emulator includes:
  a digital counter which, for each switching signal cycle, counts clock signals having a frequency higher than that of said switching signal between turn-on and turn-off of one of said first and second electronic power switching devices, and wherein, over successive switching signal cycles, contents of said digital counter are used to effectively 'dither' the turn-off time of said one of said first and second electronic power switching devices about the zero-crossing point of current through said inductor current.

14. The improvement according to claim 13, wherein, a turn-off signal for said one of said first and second electronic power switching devices is generated in response to contents of said counter matching a modification of a count latched from the previous switching signal cycle.

15. The improvement according to claim 13, wherein said modification of said count is such that if the previous switching signal cycle's turn-off signal occurred late, said count is decremented, whereas if the previous switching signal cycle's turn-off signal occurs early, said count is incremented.

* * * * *